(12) United States Patent
Liu et al.

(10) Patent No.: US 11,094,751 B2
(45) Date of Patent: Aug. 17, 2021

(54) DISPLAY PANEL, METHOD FOR FABRICATING THE SAME, AND DISPLAY DEVICE

(71) Applicants: BOE Technology Group Co., Ltd., Beijing (CN); Beijing BOE Display Technology Co., Ltd., Beijing (CN)

(72) Inventors: Sha Liu, Beijing (CN); Zhaokun Yang, Beijing (CN); Xiang Feng, Beijing (CN); Xiao Sun, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 679 days.

(21) Appl. No.: 15/775,251

(22) PCT Filed: Nov. 16, 2017

(86) PCT No.: PCT/CN2017/111322
§ 371 (c)(1),
(2) Date: May 10, 2018

(87) PCT Pub. No.: WO2018/205537
PCT Pub. Date: Nov. 15, 2018

(65) Prior Publication Data
US 2021/0134888 A1 May 6, 2021

(30) Foreign Application Priority Data
May 11, 2017 (CN) .......................... 201710329176.5

(51) Int. Cl.
*H01L 27/32* (2006.01)
*H01L 51/56* (2006.01)

(52) U.S. Cl.
CPC ............ *H01L 27/322* (2013.01); *H01L 51/56* (2013.01)

(58) Field of Classification Search
CPC ............................. H01L 27/322; H01L 51/56
See application file for complete search history.

(56) References Cited

U.S. PATENT DOCUMENTS

| 2005/0116625 | A1 | 6/2005 | Park et al. |
| 2010/0091225 | A1* | 4/2010 | Cho ................. G02F 1/133555 349/105 |

(Continued)

FOREIGN PATENT DOCUMENTS

| CN | 1622727 A | 6/2005 |
| CN | 101806975 A | 8/2010 |

(Continued)

OTHER PUBLICATIONS

Office Action for corresponding Chinese Application No. 2017103291765 dated Apr. 24, 2019.

(Continued)

*Primary Examiner* — Christine A Enad
(74) *Attorney, Agent, or Firm* — Arent Fox LLP; Michael Fainberg

(57) ABSTRACT

The disclosure provides a display panel, a method for fabricating the same, and a display device. The display panel includes a plurality of pixel elements distributed in an array, each of which includes a plurality of sub-pixel elements, wherein there is a photon crystal film layer arranged on a light exit side of the pixel elements in the display panel, and the photon crystal film layer includes photon crystal areas corresponding to the respective sub-pixel elements in a one-to-one manner; and there are a plurality of micro-holes structures arranged uniformly in each photon crystal area, and apertures of the micro-hole structures in the respective photon crystal areas match colors of light to be displayed at the sub-pixel elements corresponding to the photon crystal areas.

13 Claims, 10 Drawing Sheets

(56) References Cited

U.S. PATENT DOCUMENTS

| | | | |
|---|---|---|---|
| 2012/0249718 A1* | 10/2012 | Sohn | G02B 5/1861 |
| | | | 347/262 |
| 2014/0049812 A1* | 2/2014 | Palanchoke | G02B 5/208 |
| | | | 359/360 |
| 2015/0333223 A1 | 11/2015 | Wu | |
| 2015/0349194 A1 | 12/2015 | Cunningham et al. | |
| 2018/0321500 A1* | 11/2018 | Chen | G02B 5/201 |

FOREIGN PATENT DOCUMENTS

| | | |
|---|---|---|
| CN | 103066178 A | 4/2013 |
| CN | 103545173 A | 1/2014 |
| CN | 105093679 A | 11/2015 |
| CN | 105280832 A | 1/2016 |
| CN | 107123665 A | 9/2017 |

OTHER PUBLICATIONS

English translation of ISR for PCT/CN2017/111322 dated Feb. 14, 2018.

* cited by examiner

US 11,094,751 B2

DISPLAY PANEL, METHOD FOR FABRICATING THE SAME, AND DISPLAY DEVICE

This application is a National Stage of International Application No. PCT/CN2017/111322, filed Nov. 16, 2017, which claims the benefit of Chinese Patent Application No. 201710329176.5, filed with the Chinese Patent Office on May 11, 2017, and entitled "A display panel, a method for fabricating the same, and a display device", which are hereby incorporated by reference in their entireties.

FIELD

The present disclosure relates to the field of semiconductor technologies, and particularly to a display panel, a method for fabricating the same, and a display device.

BACKGROUND

Flat Panel Displays (FPDs) have become predominant products in the market, and there are also more and more types of displays, e.g., a Liquid Crystal Display (LCD), an Organic Light Emitted Diode (OLED) display, a Plasma Display Panel (PDP), a Field Emission Display (FED), etc.

SUMMARY

An embodiment of the disclosure provides a display panel including a plurality of pixel elements distributed in an array, each of which includes a plurality of sub-pixel elements, wherein a photon crystal film layer is arranged on a light exit side of the pixel elements in the display panel, and the photon crystal film layer includes photon crystal areas corresponding to each of the sub-pixel elements in a one-to-one manner; and a plurality of micro-holes structures are arranged uniformly in each of the photon crystal areas, and apertures of the micro-hole structures in each of the photon crystal areas match colors of light to be displayed at the sub-pixel elements corresponding to the photon crystal areas.

An embodiment of the disclosure further provides a display device including the display panel according to the embodiment of the disclosure.

An embodiment of the disclosure further provides a method for fabricating a display panel including a plurality of pixel elements distributed in an array, each of which includes a plurality of sub-pixel elements, wherein the fabricating method includes: forming a first thin film layer on a light exit side of the pixel elements; and forming photon crystal areas, corresponding to each of the sub-pixel elements, at the first thin film layer, wherein a plurality of micro-holes structures with apertures matching colors of light to be displayed at the sub-pixel elements are arranged in each of the photon crystal areas, and the micro-holes structures are arranged uniformly in each of the photon crystal areas.

DETAILED DESCRIPTION OF THE EMBODIMENTS

Figure 1:
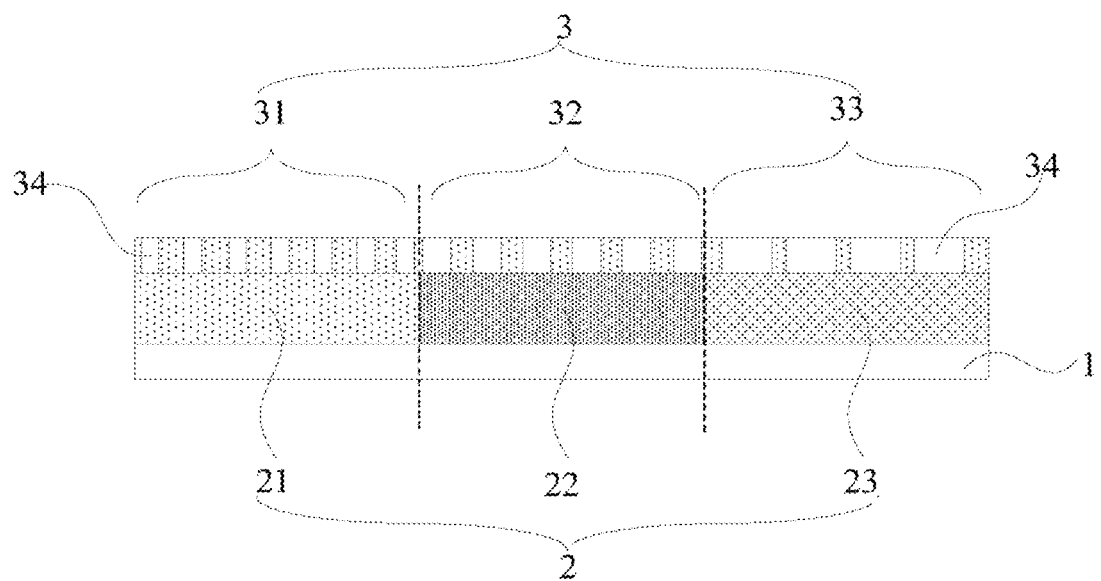
FIG. 1 is a schematic structural diagram of a display panel according to an embodiment of the disclosure.

Implementations of the embodiments of the disclosure will be described below in details with reference to the drawings. It shall be noted that identical or like reference numerals will represent identical or like elements, or elements with identical or like functions throughout the specification. The embodiments to be described below with reference to the drawings are exemplary, and only intended to illustrate the disclosure, but not to intended to limit the disclosure thereto.

A color resist film layer is commonly applied to a display panel in the related art, and for example, a color resist film layer is typically arranged on a light exit side of a backlight module in an LCD display panel to convert light of the backlight module into light in different colors. A color resist film layer can also be combined with a white OLED element in an OLED display panel to achieve color display.

However after light of the display panel in the related art passes the color resist film layer, the brightness of the display panel is typically lowered. Furthermore a fabrication process of the display panel may also be complicated due to the color resist film layer fabricated through repeated exposure, so that the fabrication cost may become high.

Referring to FIG. 1, an embodiment of the disclosure provides a display panel including a plurality of pixel elements 2 distributed in an array, each of which includes a plurality of sub-pixel elements 21, 22, and 23, where there is a photon crystal film layer 3 arranged on a light exit side of the pixel elements 2 in the display panel, and the photon crystal film layer 3 includes photon crystal areas 31, 32, and 33 corresponding to the respective sub-pixel elements 21, 22, and 23 in a one-to-one manner; and there are a plurality of micro-holes structures 34 arranged uniformly in each of the photon crystal areas 31, 32, and 33, and apertures of the micro-hole structures 34 in the respective photon crystal areas 31, 32, and 33 match colors of light to be displayed at the sub-pixel elements 21, 22, and 23 corresponding to the photon crystal areas 31, 32, and 33.

For example, the display panel includes a plurality of pixel elements 2 arranged on an underlying substrate 1, and FIG. 1 illustrates one of the pixel elements 2 by way of an example, where each pixel element 2 can include three sub-pixel elements 21, 22, and 23. Optionally as illustrated in FIG. 1, each pixel element 2 includes a first sub-pixel element 21, a second sub-pixel element 22, and a third sub-pixel element 23. Optionally the photon crystal film layer 3 includes a plurality of photon crystal elements distributed in an array, and each photon crystal element includes a first photon crystal area 31 corresponding to the first sub-pixel element 21, a second photon crystal area 32 corresponding to second sub-pixel element 22, and a third photon crystal area 33 corresponding to the third sub-pixel element 23; and the aperture of the micro-hole structures 34 in the first photon crystal area 31 matches the color of light to be displayed at the first sub-pixel element 21, the aperture of the micro-hole structures 34 in the second photon crystal area 32 matches the color of light to be displayed at the second sub-pixel element 22, and the aperture of the micro-hole structures 34 in the third photon crystal area 33 matches the color of light to be displayed at the third sub-pixel element 23. That is, in an optional implementation, if the first sub-pixel element 21 is intended to exit red light, then the micro-hole structures 34 with the aperture corresponding to the red light may be arranged in the first photon crystal area 31; if the second sub-pixel element 22 is intended to exit green light, then the micro-hole structures 34 with the aperture corresponding to the green light may be arranged in the second photon crystal area 32; and if the third sub-pixel element 23 is intended to exit blue light, then the micro-hole structures 34 with the aperture corresponding to the blue light may be arranged in the third photon crystal area 33.

Optionally the colors of light to be transmitted in the photon crystal areas 31, 32, and 33 are proportional to the apertures of the micro-hole structures 34. For example, there are typically a larger aperture of the micro-hole structures 34 for red light to be transmitted, a smaller aperture of the micro-hole structures 34 for blue light to be transmitted, and such an aperture of the micro-hole structures 34 for green light to be transmitted that lies between the larger aperture and the smaller aperture. A color of light typically corresponds to a wavelength thereof, and in order to enable the different sub-pixel elements 21, 22, and 23 to display light of different colors, the apertures of the micro-hole structures 34 in the respective photon crystal areas 31, 32, and 33 may be set to be proportional to wavelengths of light to be displayed at the sub-pixel elements 21, 22, and 23 corresponding to the photon crystal areas 31, 32, and 33.

Figure 2:
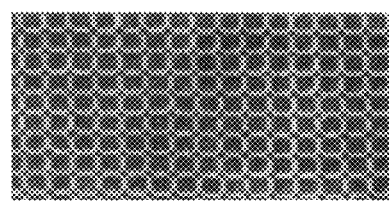
FIG. 2 illustrates a photon crystal film layer with a uniform aperture according to an embodiment of the disclosure.

It shall be noted that a photon crystal is a new optical material distributed periodically in a space. The photon crystal can modulate an electromagnetic wave at a corresponding wavelength, and while the electromagnetic wave is propagating in the photon crystal structure, the electromagnetic wave is modulated due to Prague scattering, thus resulting in an energy band structure of the electromagnetic wave, where there is a band gap, i.e., a photon band gap, between one energy band and the other, and all the photons with energy lying in the photon band gap cannot enter the crystal, that is, only light at a specific frequency will be totally prohibited from propagating in a photon crystal with a specific periodical space, and thus will be transmitted. In the embodiment of the disclosure, there are micro-hole structures 34 with different apertures in the different photon crystal areas 31, 32, and 33, and since there are different apertures, there are different composite refractive indexes of mediums in the different photon crystal areas 31, 32, and 33 of the photon crystal film layer 3, so light in different colors can exit the photon crystal areas. FIG. 2 illustrates a photon crystal film layer 3, with a specific aperture according to an embodiment of the disclosure.

Typically, only the micro-hole structures 34 with a periodical space at the sub-micrometer order can modulate light, so in the embodiment of the disclosure, the space between the centers of two adjacent micro-hole structures 34 in any one of the photon crystal areas 31, 32, and 33 lies in the range of 100 nm to 1000 nm, and there is a uniform space between centers of two adjacent micro-hole structures 34 in the same one of the photon crystal areas 31, 32, and 33.

Optionally in order to provide the display panel with higher brightness, the micro-hole structures 34 are distributed at a single layer within the photon crystal film layer 3. Optionally the depth of the micro-hole structures 34 is equal to the thickness of the photon crystal film layer 3, that is, the micro-hole structures 34 run through the photon crystal film layer 3 as illustrated in FIG. 1.

In an optional implementation, the material of the photon crystal film layer 3 can be a photosensitive resin material, a silicon based semiconductor material, a metal oxide semiconductor material, etc.

At present the OLED display panel in the related art is typically fabricated in two structures: in one of the structures, white-light OLED elements operates with color filters to display in colors, where there is an extended process flow of fabricating the OLED display panel in this structure, and also the OLED display panel may be hindered from being lightweight and thinned; and in the other structure, OLED elements in three primary colors of RGB display separately, where a Fine Metal Mask (FMM) is required to be used in a vapor-plating process in a process of fabricating the OLED display panel in this structure, but there is only a Pixels Per Inch (PPI) below 1000 available to the FMM in the related art, so the OLED display panel in this structure may also be hindered from being applied to a product with a higher PPI. Furthermore the OLED display panel displaying separately in the three primary colors of RGB may also suffer from a short service lifetime thereof due to a short service lifetime of a blue light-emitting material.

Optionally the display panel above according to the embodiment of the disclosure can be an OLED display panel, and at this time, the pixel elements 2 include white-light OLED elements; and white light emitted by the respective white-light OLED elements exit as monochromatic light through the micro-hole structures in the corresponding photon crystal areas. In the embodiment of the disclosure, the photon crystal thin film layer 3 is prepared on the white-light OLED elements, so that there are three or more photon crystal areas 31, 32, and 33, of the photon crystal thin film layer 3, configured respectively to transmit light rays at least in three bands of red, green, and blue to take the place of the positions and functions of red, green, and blue color resist in the traditional color resist film layer so as to avoid a loss of light brightness arising from the color resist in the color filters in the traditional process, and an increased cost and a complicated process arising from repeated exposure. As compared with the existing OLED display panel displaying separately in the three primary colors of RGB, the OLED display panel according to the embodiment of the disclosure can be provided with high brightness and a wide color gamut as well as a longer service lifetime and a higher pixel density thereof.

Optionally the display panel above according to the embodiment of the disclosure can alternatively be a liquid crystal display panel, and the pixel elements 2 include liquid crystal layers.

Figure 17:
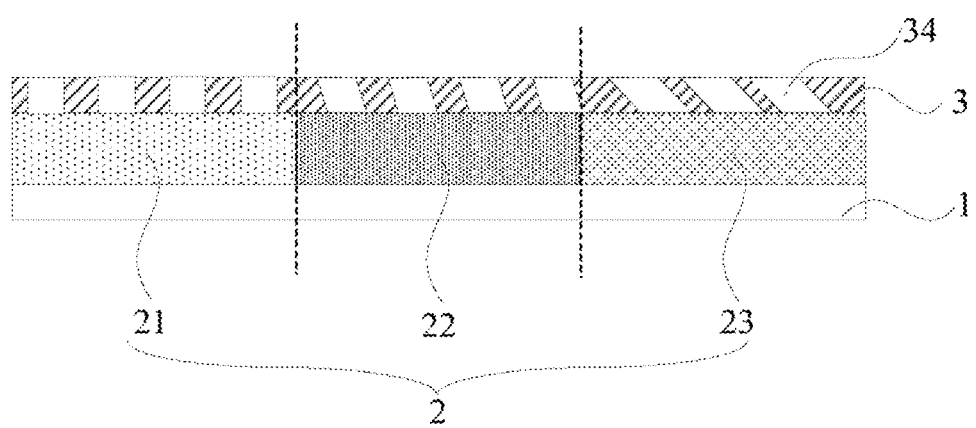
FIG. 17 is a schematic structural diagram of the display panel after micro-hole structured with different apertures are formed in different photon crystal areas according to the second embodiment of the disclosure.

Optionally in the display panel above according to the embodiment of the disclosure, as illustrated in FIG. 1, the micro-hole structures 34 in the respective photon crystal areas 31, 32, and 33 can have the same inclination angle from the surface of the photon crystal film layer 3, and for example, as illustrated in FIG. 1, all the micro-hole structures 34 are perpendicular to the surface of the photon crystal film layer 3. Alternatively dependent upon a different fabrication process, in the display panel above according to the embodiment of the disclosure, as illustrated in FIG. 17, the respective micro-hole structures in the respective photon crystal areas corresponding to the respective sub-pixel elements to display light in the same color have the same inclination angle from the surface of the photon crystal film layer, and for example, in FIG. 17, the respective micro-hole structures 34 are perpendicular to the surface of the photon crystal film layer 3 in the photon crystal areas corresponding to the left sub-pixel element 21; and the respective micro-hole structures 34 are inclined leftward at the same angle from the surface of the photon crystal film layer 3 in the photon crystal areas corresponding to the right sub-pixel element 23. Also the micro-hole structures in the respective photon crystal areas corresponding to the sub-pixel elements to display light in different colors have different inclination angles from the surface of the photon crystal film layer, and for example, in FIG. 17, the two middle and right sub-pixel elements 22 and 23 display light in different colors, so the micro-hole structures 34 in the corresponding photon crystal areas have different inclination angles from the surface of the photon crystal film layer.

Based upon the same inventive idea, an embodiment of the disclosure further provides a display device including the display panel above according to the embodiment of the disclosure. The display device can be a mobile phone, a tablet computer, a TV set, a monitor, a notebook computer, a digital photo frame, a navigator, or any other product or component with a display function. Reference can be made to the embodiment of the display panel above for an implementation of the display device, and a repeated description thereof will be omitted here.

Figure 3:
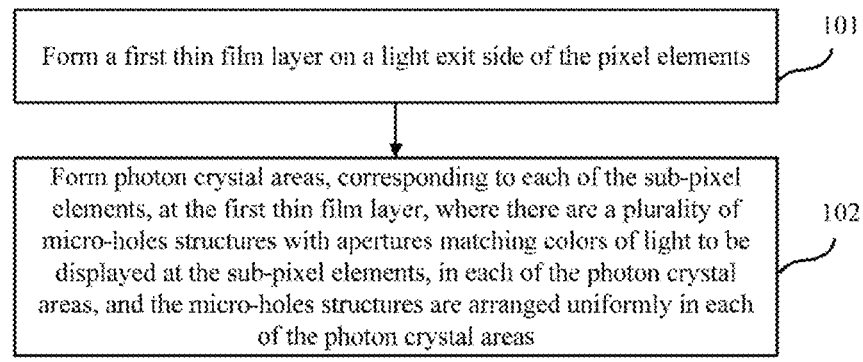
FIG. 3 is a flow chart of a method for fabricating a display panel according to an embodiment of the disclosure.

Based upon the same inventive idea, referring to FIG. 3, an embodiment of the disclosure further provides a method for fabricating a display panel including a plurality of pixel elements distributed in an array, each of which includes a plurality of sub-pixel elements, where the fabricating method includes the following steps.

The step 101 is to form a first thin film layer on a light exit side of the pixel elements.

The step 102 is to form photon crystal areas, corresponding to the respective sub-pixel elements, at the first thin film layer, where there are a plurality of micro-holes structures, with apertures matching colors of light to be displayed at the sub-pixel elements, in the respective photon crystal areas, and the micro-holes structures are arranged uniformly in each photon crystal area.

Optionally each pixel element of the display panel can include a first sub-pixel element, a second sub-pixel element, and a third sub-pixel element; and forming the photon crystal areas, corresponding to the respective sub-pixel elements, at the first thin film layer in the step 102 can optionally include: forming a first photon crystal area corresponding to the first sub-pixel element at the first thin film layer, where there are micro-hole structures with a first aperture in the first photon crystal area; forming a second photon crystal area corresponding to the second sub-pixel element at the first thin film layer, where there are micro-hole structures with a second aperture in the second photon crystal area; and forming a third photon crystal area corresponding to the third sub-pixel element at the first thin film layer, where there are micro-hole structures with a third aperture in the third photon crystal area.

In an optional implementation, the first thin film layer can be a silicon based semiconductor material or a metal oxide semiconductor material, or can be a photosensitive resin material, or of course, the first thin film layer can alternatively be any other material which can be etched into a structure including holes. Optionally in order to simplify the fabrication process, the first thin film layer is a silicon based semiconductor material.

The step 102 in which the photon crystal areas corresponding to the respective sub-pixel elements are formed at the first thin film layer will be described below in details respectively in the following examples.

For example, the first thin film layer is a silicon based semiconductor material or a metal oxide semiconductor material, which can be etched into a structure including micro-holes, commonly applied to the display panel in the related art, so forming the photon crystal areas, corresponding to the respective sub-pixel elements, at the first thin film layer in the step 102 optionally includes followings.

Coating the first thin film layer with a photo resist layer.

Forming a polymer molecule film layer above the photo resist layer, where the polymer molecule film layer includes polymer molecules arranged uniformly at a preset space, where the preset space can be the space between the centers of two adjacent polymer molecules.

Shielding the sub-pixel elements, to display light in the other colors, using a mask, while only exposing one sub-pixel element to display light in one color, and illuminating the photoresist layer with light at a first inclination angle for a first preset length of time while being shielded by the polymer molecules.

Moving the mask to shield the sub-pixel elements, to display light in the other colors while only exposing another sub-pixel element to display light in another color, and illuminating the photoresist layer with light at a second inclination angle for a second preset length of time while being shielded by the polymer molecules until all the sub-pixel elements to display in the colors are exposed.

Removing the polymer molecule film layer.

Forming a pattern of the photoresist layer through development.

Removing the part of the first thin film layer, which is not covered with the photo resist layer, and forming the micro-hole structures in the respective photon crystal areas at the first thin film layer.

In another example, when the material of the first thin film layer is a photosensitive resin material, forming the photon crystal areas, corresponding to the respective sub-pixel elements, at the first thin film layer in the step 102 optionally includes followings.

Forming a polymer molecule film layer above the first thin film layer, where the polymer molecule film layer includes polymer molecules arranged uniformly at a preset space.

Shielding the sub-pixel elements, to display light in the other colors, using a mask, while only exposing one sub-pixel element to display light in one color, and illuminating the photoresist layer with light at a first inclination angle for a first preset length of time while being shielded by the polymer molecules.

Moving the mask to shield the sub-pixel elements, to display light in the other colors while only exposing another sub-pixel element to display light in another color, and illuminating the photoresist layer with light at a second inclination angle for a second preset length of time while being shielded by the polymer molecules until all the sub-pixel elements to display in the colors are exposed.

Removing the polymer molecule film layer.

Removing the part of the first thin film layer, which is covered with the polymer molecules, through development, and forming the micro-hole structures in the respective photon crystal areas at the first thin film layer.

In an optional implementation, forming the polymer molecule film layer can optionally include followings.

Determining the number of polymer molecules to be needed, according to an area to be coated, and the diameter of a polymer molecule.

Determining the volume of polymer solution to be needed, according to the number of polymer molecules to be needed, and the density of the polymer solution.

Dropping the polymer solution in the area to be coated, in droplets.

In an optional implementation, when the display panel is an OLED display panel, before the first thin film is formed on the light exit side of the pixel elements, the fabricating method can further include forming white-light OLED elements; and forming the first thin film on the light exit side of the pixel elements particularly includes forming the first thin film on the light exit side of the white-light OLED elements.

Of course, the micro-hole structures with the different apertures are formed in the different photon crystal areas at the first thin film layer by moving the mask, and exposing in different directions, as described above only by way of an example, but alternatively in an optional implementation, a polymer molecule layer can be coated, and the distance between a light source and the display panel covered with the polymer molecules can be adjusted in the different photon crystal areas to thereby form the micro-hole structures with the different apertures in the different photon crystal areas, that is, the micro-hole structures with the different apertures can also be formed at long and short exposure distances. Furthermore polymers with the size of the molecule diameter can alternatively be formed in the different photon crystal areas to thereby form the micro-hole structures with the different apertures in the different photon crystal areas.

In order to describe the method for fabricating a display panel according to the embodiment of the disclosure in further details, embodiments thereof will be described below with reference to FIG. 4 to FIG. 17.

In some embodiments, an optional method for fabricating a display panel according to the embodiment of the disclosure includes the following steps.

The first step is to form pixel elements 2 on an underlying substrate 1, for example, white-light OLED elements on a glass substrate. A step of forming the white-light OLED elements is the same as the step of forming white-light OLED elements in the related art, so a repeated description thereof will be omitted here.

Figure 4:
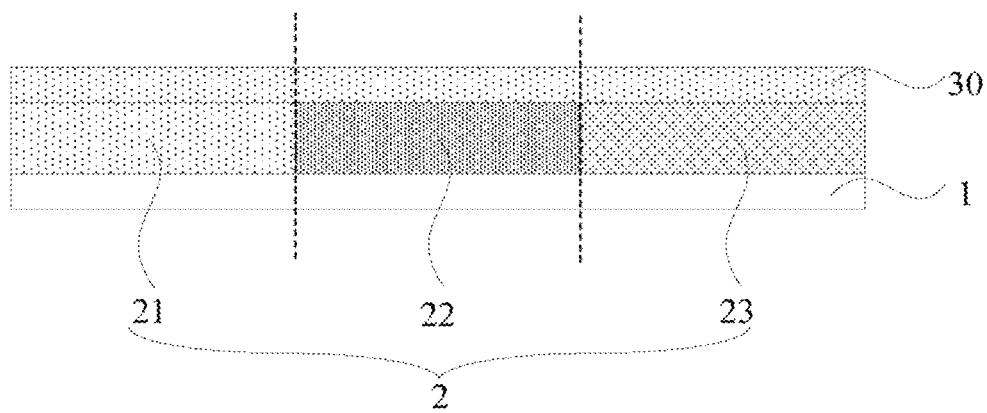
FIG. 4 is a schematic structural diagram of the display panel after a first thin film layer is fabricated according to a first embodiment of the disclosure.

The second step is to form a first thin film layer 30 on a light exit side of the pixel elements 2. The first thin film layer here is a silicon based semiconductor material. FIG. 4 illustrates a schematic diagram of the display panel after the first thin film layer 30 is formed above the pixel elements 2.

Figure 5:
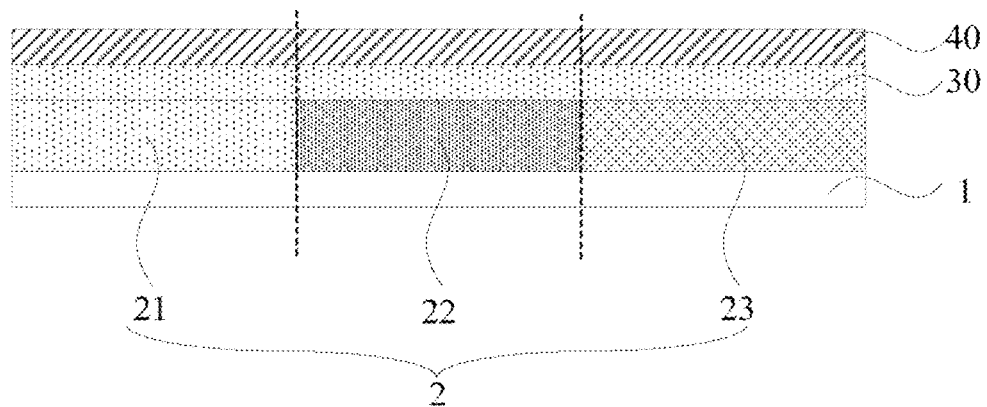
FIG. 5 is a schematic structural diagram of the display panel after a photo resist layer is fabricated according to the first embodiment of the disclosure.

The third step is to coat the first thin film layer 30 with a photoresist layer 40. FIG. 5 illustrates a schematic diagram of the display panel after the photoresist layer 40 is formed above the first thin film layer 30.

Figure 6:
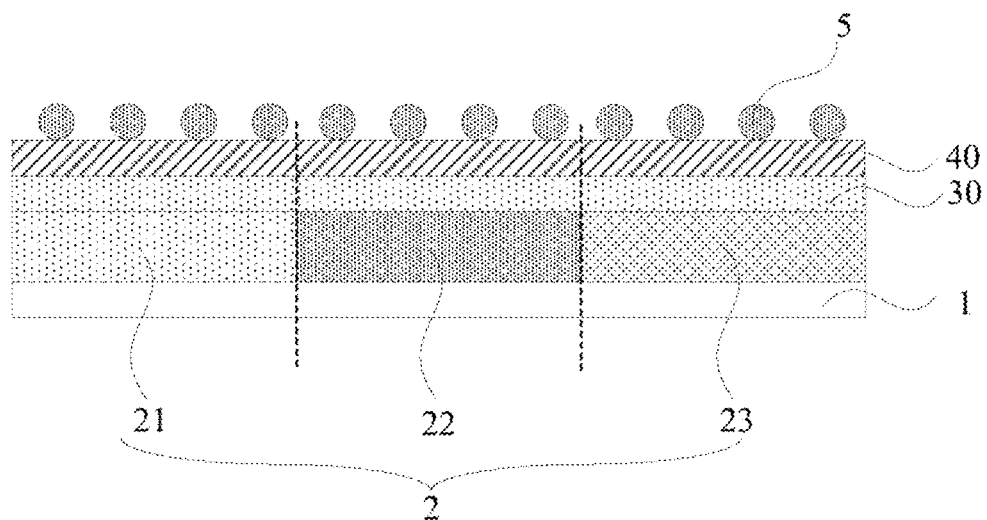
FIG. 6 is a schematic structural diagram of the display panel after polymer molecules are fabricated according to the first embodiment of the disclosure.

The fourth step is to form periodically and uniformly arranged polymer molecules 5 on the photoresist layer 40 from a colloid in an ad-hoc manner. FIG. 6 illustrates a schematic diagram of the display panel after the polymer molecules 5 are formed above the photoresist layer 40.

The step of forming the periodically and uniformly arranged polymer molecules on the photoresist layer from the colloid in the ad-hoc manner includes followings.

Determining the number of polymer molecules to be needed, according to an area to be coated, and the diameter of a polymer molecule; determining the volume of polymer solution to be needed, according to the number of polymer molecules to be needed, and the density of the polymer solution, where the density of the polymer solution here can refer to the number of polymer molecules in a unit volume of solution; and dropping the polymer solution in the area to be coated, in droplets.

It shall be noted that the polymer molecules according to the embodiment of the disclosure have been prepared as specifically specified suspension, and both the molecule diameter of a polymer molecule, and the density of the polymer solution are known as a raw material product available from DuPont Corp. The polymer molecules are formed from the colloid in the ad-hoc manner as commonly applicable to preparation of a photon crystal in the related art. The polymer molecules (e.g., Polystyrene) are dispersed in the solution, where the polymer molecules are typically at the sub-micrometer order of magnitude, and the respective polymer molecules are concentrated together in a precisely ordered manner under the actions of a short-range electrostatic force and a long-range Van Der Waals force, and arranged spontaneously in a regular and ordered structure.

Figure 7:
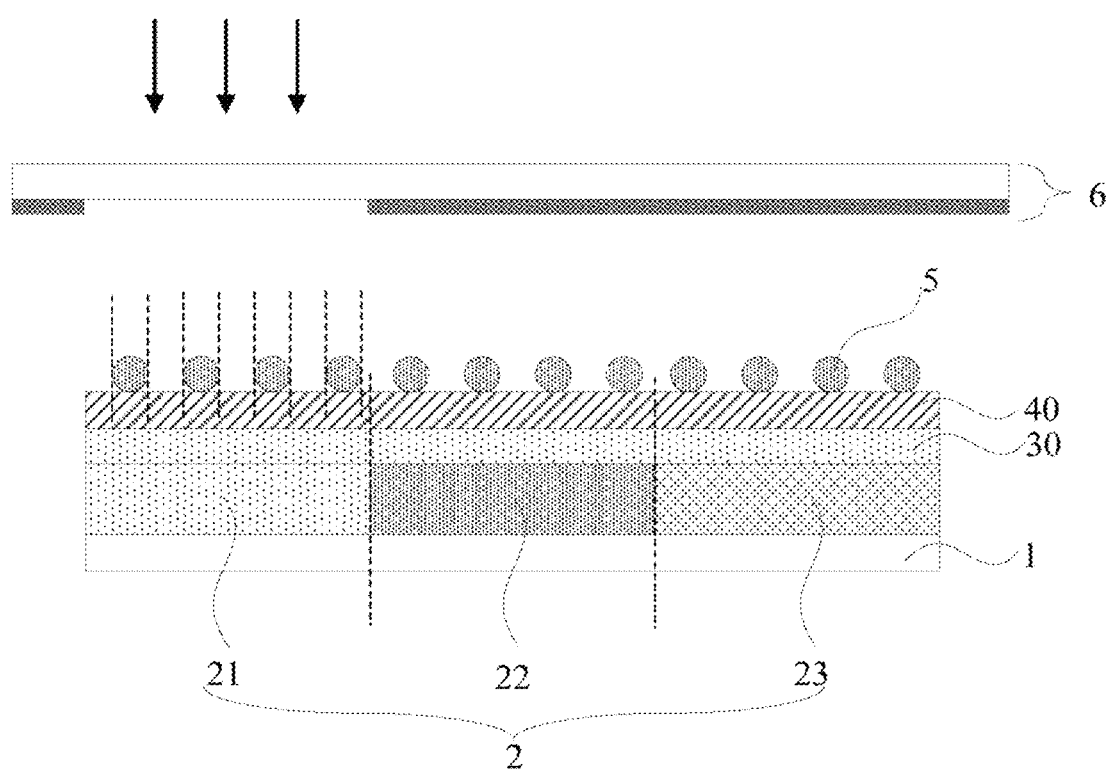
FIG. 7 is a schematic diagram when the display panel is illuminated at a first inclination angle according to the first embodiment of the disclosure.
Figure 8:
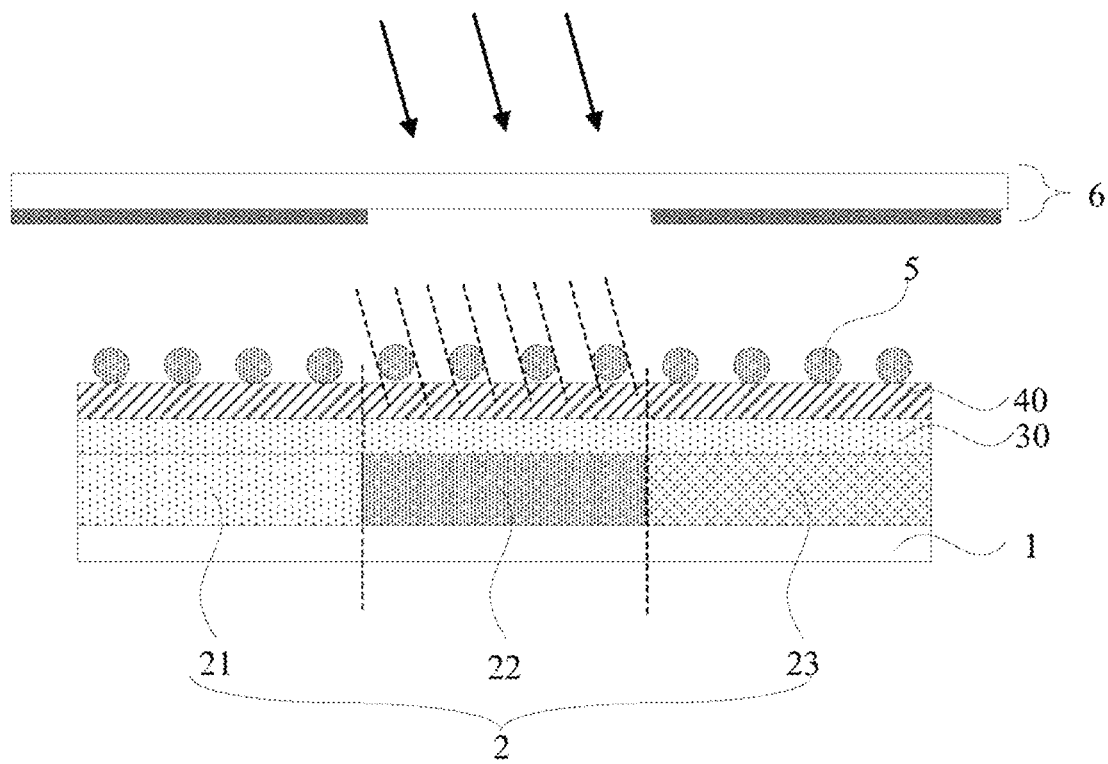
FIG. 8 is a schematic diagram when the display panel is illuminated at a second inclination angle according to the first embodiment of the disclosure.
Figure 9:
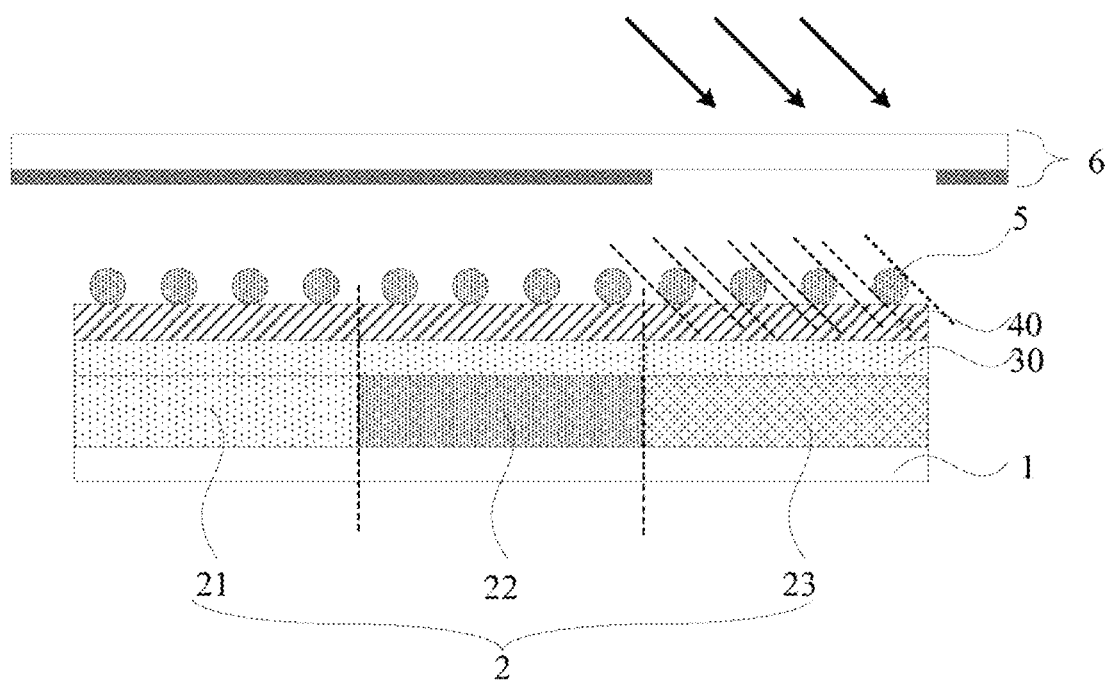
FIG. 9 is a schematic diagram when the display panel is illuminated at a third inclination angle according to the first embodiment of the disclosure.

The fifth step is to illuminate the photoresist layer 40 shielded by the polymer molecules 5 with light at a first inclination angle for a first preset length of time while being shielded by a mask 6 as illustrated in FIG. 7; to move the mask 6 over a distance of one sub-pixel element 21, and to illuminate the photoresist layer 40 shielded by the polymer molecules 5 with light at a second inclination angle for a second preset length of time as illustrated in FIG. 8; to move the mask 6 over a distance of one sub-pixel element 22, and to illuminate the photoresist layer 40 shielded by the polymer molecules 5 with light at a third inclination angle for a third preset length of time as illustrated in FIG. 9; and to remove the mask. The mask 6 can be arranged with an opening in an area corresponding to one sub-pixel element in each pixel element, so that the mask 6 is moved, and the illumination direction is adjusted, thus resulting in the photon crystal areas in which there are the micro-hole structures with the different apertures.

The sixth step is to remove the polymer molecule layer.

Figure 10:
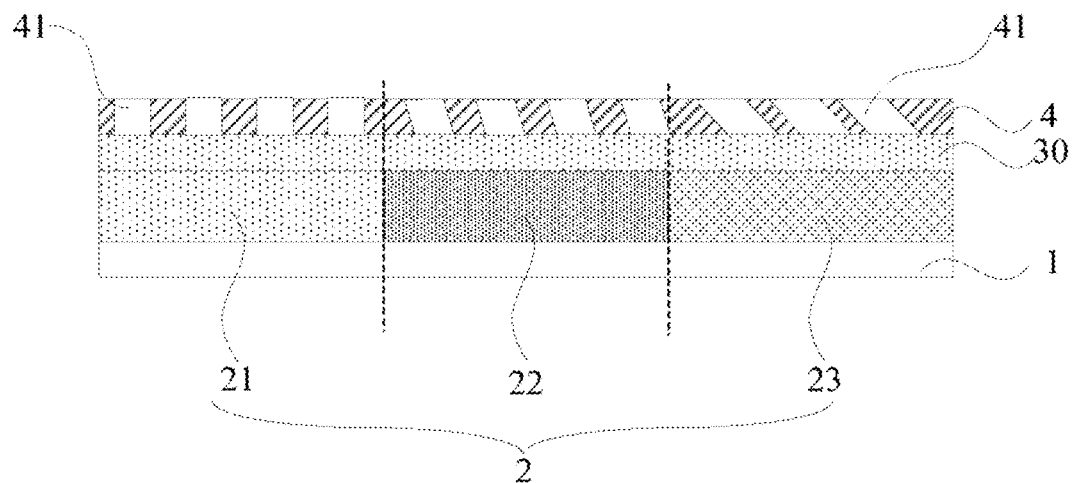
FIG. 10 is a schematic structural diagram of the display panel after the patterned photo resist layer is fabricated according to the first embodiment of the disclosure.

The seventh step is to form the patterned photoresist layer 4 through development, where the patterned photoresist layer 4 includes photoresist layer micro-holes 41, with different apertures, corresponding to the different pixel sub-pixel elements. Since the photoresist layer shielded by the polymer molecules is not illuminated, it is removed in the development process. FIG. 10 illustrates a schematic diagram of the display panel after the patterned photoresist layer 4 is formed.

Figure 11:
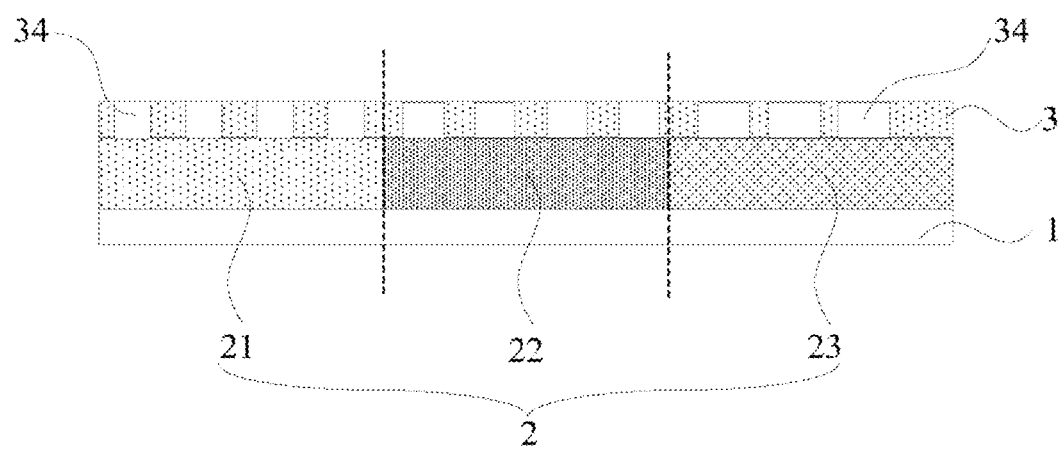
FIG. 11 is a schematic structural diagram of the display panel after micro-hole structured with different apertures are formed in different photon crystal areas according to the first embodiment of the disclosure.

The eighth step is to remove the part of the first thin film layer 30, which is not shielded by the pattern of the patterned photoresist layer 4 while being shielded by the patterned photoresist layer 4, to form the micro-hole structures 34 with the first aperture in the first photon crystal area corresponding to the first sub-pixel element 21 at the first thin film layer 30, the micro-hole structures 34 with the second aperture in the second photon crystal area corresponding to the second sub-pixel element 22 at the first thin film layer 30, and the micro-hole structures 34 with the third aperture in the third photon crystal area corresponding to the third sub-pixel element 23 at the first thin film layer 30, and to remove the patterned photoresist layer 4, thus forming the resulting photon crystal film layer 3. FIG. 11 illustrates a schematic diagram of the display panel after the photon crystal film layer 3 is formed.

In some embodiments, an optional method for fabricating a display panel according to the embodiment of the disclosure includes the following steps.

The first step is to form pixel elements 2 on an underlying substrate 1, for example, white-light OLED elements on a glass substrate. A step of forming the white-light OLED elements is the same as the step of forming white-light OLED elements in the related art, so a repeated description thereof will be omitted here.

Figure 12:
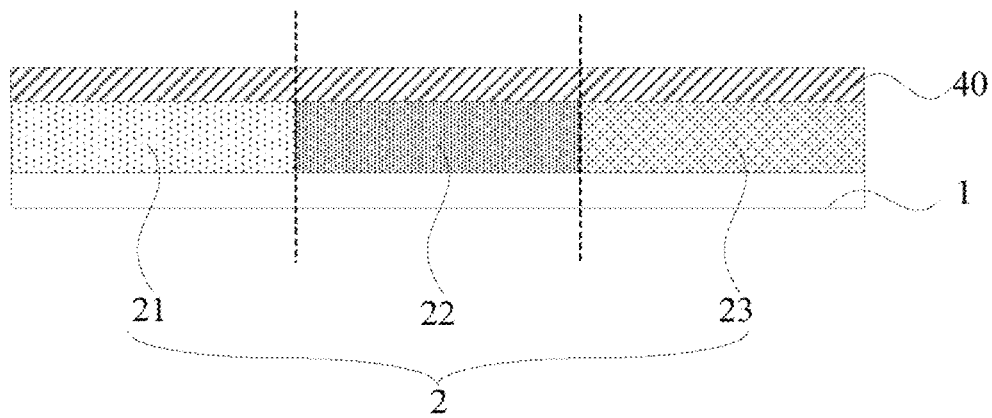
FIG. 12 is a schematic structural diagram of the display panel after the photo resist layer is fabricated according to a second embodiment of the disclosure.

The second step is to coat with a photoresist layer 40 on a light exit side of the pixel elements 2. The photoresist layer 40 here is the first thin film layer, that is, the first thin film layer is a photosensitive resin material. FIG. 12 illustrates a schematic diagram of the display panel after the photoresist layer 40 is formed on the light exit side of the pixel elements 2.

Figure 13:
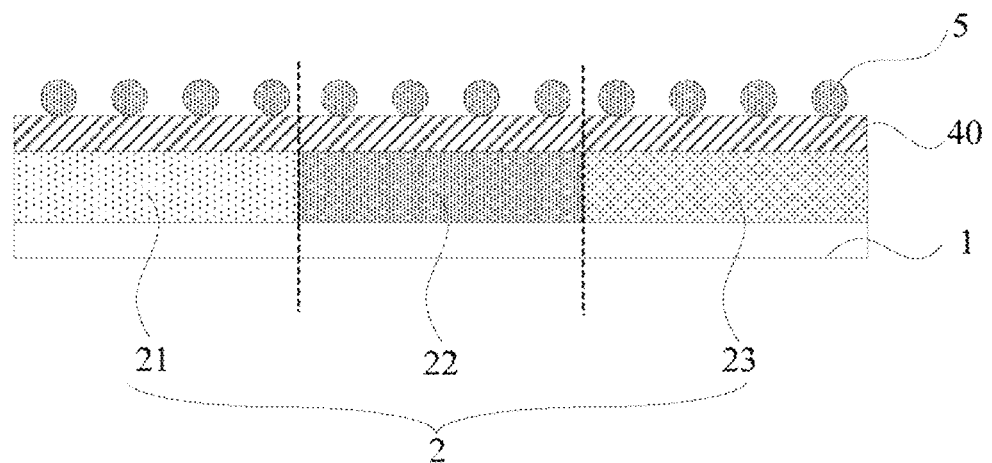
FIG. 13 is a schematic structural diagram of the display panel after the polymer molecules are fabricated according to the second embodiment of the disclosure.

The third step is to form periodically and uniformly arranged polymer molecules 5 on the photoresist layer 40 from a colloid in an ad-hoc manner. FIG. 13 illustrates a schematic diagram of the display panel after the polymer molecules 5 are formed above the photoresist layer 40.

Optionally the step of forming the periodically and uniformly arranged polymer molecules on the photoresist layer from the colloid in the ad-hoc manner is the same as in the aforementioned embodiments, so a repeated description thereof will be omitted here.

Figure 14:
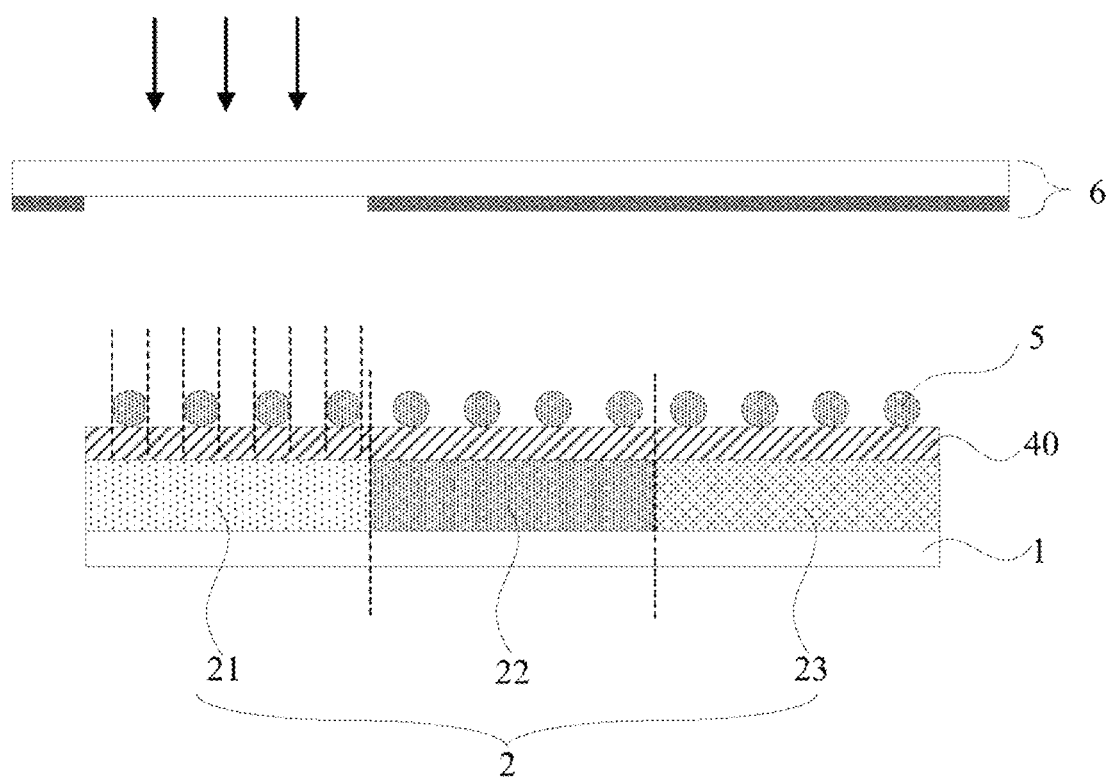
FIG. 14 is a schematic diagram when the display panel is illuminated at a first inclination angle according to the second embodiment of the disclosure.
Figure 15:
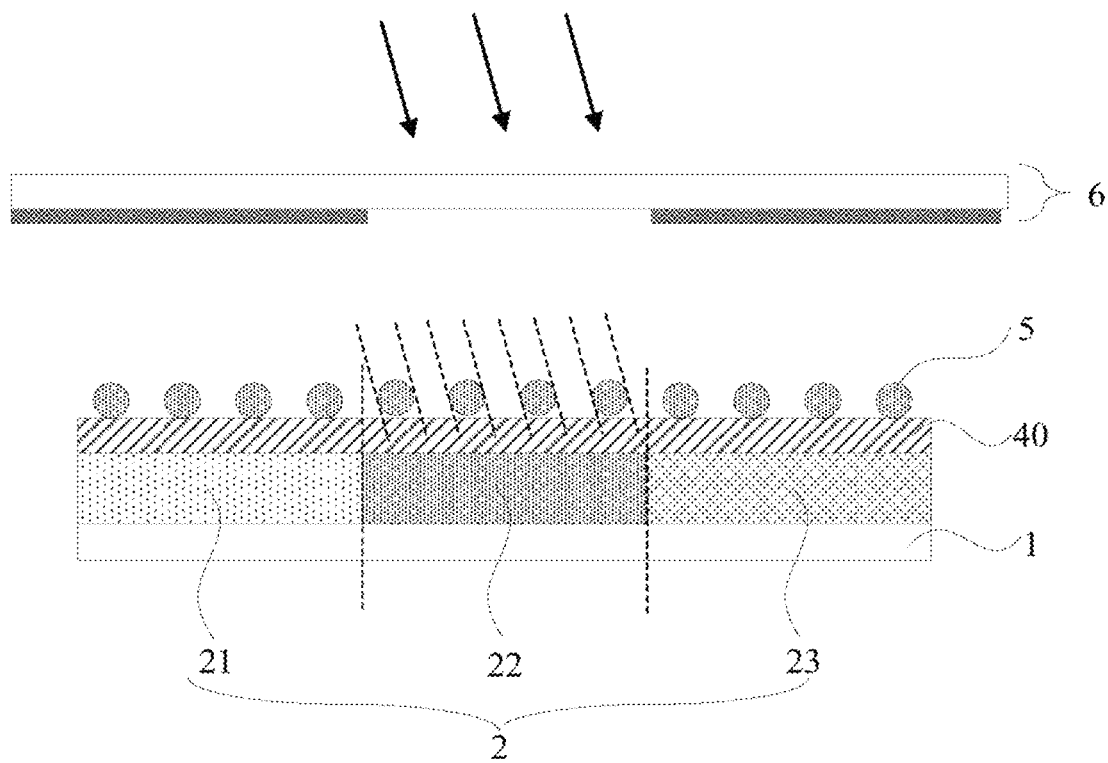
FIG. 15 is a schematic diagram when the display panel is illuminated at a second inclination angle according to the second embodiment of the disclosure.
Figure 16:
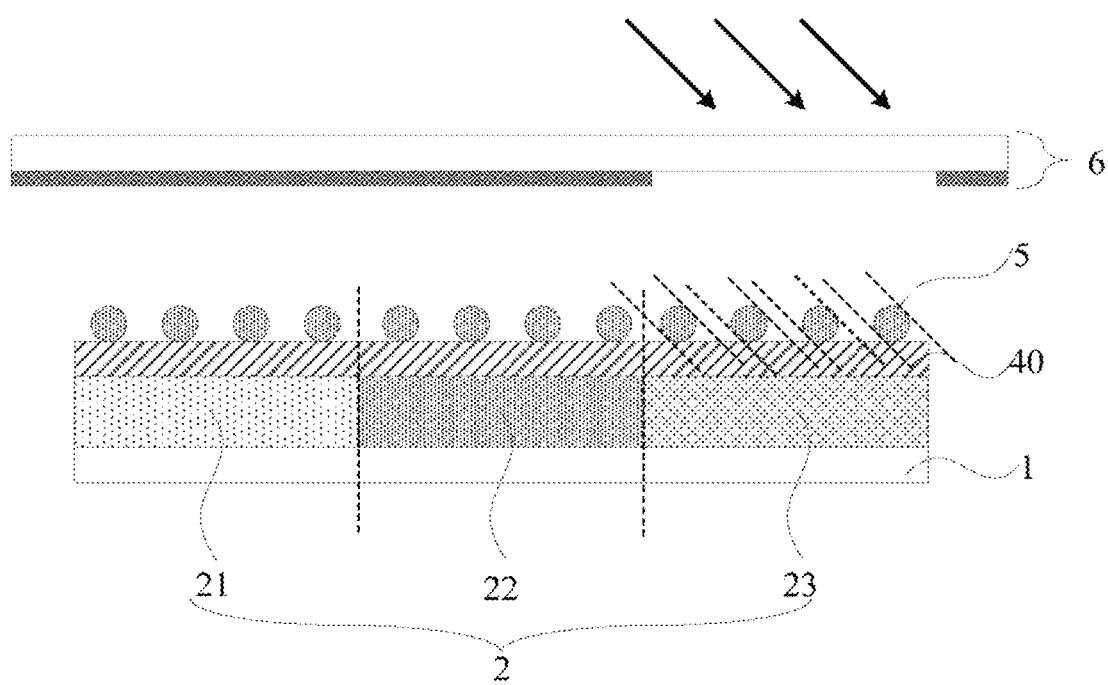
FIG. 16 is a schematic diagram when the display panel is illuminated at a third inclination angle according to the second embodiment of the disclosure.

The fourth step is to illuminate the photoresist layer 40 shielded by the polymer molecules 5 with light at a first inclination angle for a first preset length of time while being shielded by a mask 6 as illustrated in FIG. 14; to move the mask 6 over a distance of one sub-pixel element 21, and to illuminate the photoresist layer 40 shielded by the polymer molecules 5 with light at a second inclination angle for a second preset length of time as illustrated in FIG. 15; to move the mask 6 over a distance of one sub-pixel element 22, and to illuminate the photoresist layer 40 shielded by the polymer molecules 5 with light at a third inclination angle for a third preset length of time as illustrated in FIG. 16; and to remove the mask. The mask 6 can be arranged with an opening in an area corresponding to one sub-pixel element in each pixel element, so that the mask 6 is moved, and the illumination direction is adjusted, thus resulting in the photon crystal areas in which there are the micro-hole structures with the different apertures.

The fifth step is to remove the polymer molecule layer.

The sixth step is to remove the part of the photoresist layer 40, which is shielded by the polymer molecules 5, through development, to form the micro-hole structures 34 with the first aperture in the first photon crystal area corresponding to the first sub-pixel element 21 at the photoresist layer 40, the micro-hole structures 34 with the second aperture in the second photon crystal area corresponding to the second sub-pixel element 22 at the photoresist layer 40, and the micro-hole structures 34 with the third aperture in the third photon crystal area corresponding to the third sub-pixel element 23 at the photoresist layer 40, and to remove the patterned photoresist layer 40, thus forming the resulting photon crystal film layer 3. FIG. 17 illustrates a schematic diagram of the display panel after the photon crystal film layer 3 is formed.

Advantageous effects of the embodiments of the disclosure are as follows: in the display panel according to the embodiment of the disclosure, the photon crystal film layer is arranged on the light exit side, the photon crystal film layer includes the photon crystal areas corresponding to the respective sub-pixel elements in a one-to-one manner, there are a plurality of micro-holes structures arranged uniformly in each photon crystal area, and the apertures of the micro-hole structures in the respective photon crystal areas match the colors of light to be displayed at the sub-pixel elements corresponding to the photon crystal areas. The periodically and uniformly arranged micro-hole structures with the specific apertures can transmit light at the corresponding wavelengths, and shield light at the other wavelengths, and the light of the display panel can be converted into light in the different colors after passing the different photon crystal areas, so the photon crystal film layer can take the place of the traditional color resist film layer to thereby improve the brightness of the display panel, and address the problems of a complicated fabrication process and a high fabrication cost thereof due to the color resist film layer fabricated through repeated exposure.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A display panel, comprising a plurality of pixel elements distributed in an array, each of which comprises a plurality of sub-pixel elements, wherein a photon crystal film layer is arranged on a light exit side of the pixel elements in the display panel, and the photon crystal film layer comprises photon crystal areas corresponding to each of the sub-pixel elements in a one-to-one manner; and a plurality of micro-holes structures are arranged uniformly in each of the photon crystal area, and a aperture of the micro-hole structures in each of the photon crystal areas match colors of light to be displayed at the sub-pixel elements corresponding to the photon crystal areas;

wherein the display panel is an OLED display panel, and the pixel elements comprise white-light OLED elements; and white light emitted by each of the white-light OLED elements exit as monochromatic light through the micro-hole structures in corresponding photon crystal areas.

2. The display panel according to claim 1, wherein the aperture of the micro-hole structures in each of the photon crystal areas is proportional to a wavelength of light to be displayed at the sub-pixel element corresponding to the photon crystal area.

3. The display panel according to claim 1, wherein the micro-hole structures are distributed at a single layer within the photon crystal film layer.

4. The display panel according to claim 3, wherein a depth of the micro-hole structures is equal to a thickness of the photon crystal film layer.

5. The display panel according to claim 1, wherein a space between centers of two adjacent micro-hole structures in each of the photon crystal areas ranges from 100 nm to 1000 nm.

6. The display panel according to claim 1, wherein the material of the photon crystal film layer is a photosensitive resin material, a silicon based semiconductor material or a metal oxide semiconductor material.

7. The display panel according to claim 1, wherein each of the pixel elements comprises a first sub-pixel element, a second sub-pixel element, and a third sub-pixel element;
the photon crystal film layer comprises a first photon crystal area corresponding to the first sub-pixel element, a second photon crystal area corresponding to second sub-pixel element, and a third photon crystal area corresponding to the third sub-pixel element; and
an aperture of the micro-hole structures in the first photon crystal area matches a color of light to be displayed at the first sub-pixel element, an aperture of the micro-hole structures in the second photon crystal area matches a color of light to be displayed at the second sub-pixel element, and an aperture of the micro-hole structures in the third photon crystal area matches a color of light to be displayed at the third sub-pixel element.

8. The display panel according to claim 1, wherein each of the micro-hole structures in each of the photon crystal areas corresponding to each of the sub-pixel elements for displaying light in a same color have a same inclination angle from a surface of the photon crystal film layer; and
the micro-hole structures in each of the photon crystal areas corresponding to the sub-pixel elements for displaying light in different colors have different inclination angles from the surface of the photon crystal film layer.

9. A display device, comprising the display panel according to claim 1.

10. A method for fabricating a display panel comprising a plurality of pixel elements distributed in an array, each of which comprises a plurality of sub-pixel elements, wherein the fabricating method comprises:
forming a first thin film layer on a light exit side of the pixel elements; and
forming photon crystal areas, corresponding to each of the sub-pixel elements, at the first thin film layer, wherein a plurality of micro-holes structures with apertures matching colors of light to be displayed at the sub-pixel elements are arranged in each of the photon crystal areas, and the micro-holes structures are arranged uniformly in each of the photon crystal area;

wherein the display panel is an OLED display panel;
before the first thin film is formed on the light exit side of the pixel elements, the fabricating method further comprises: forming white-light OLED elements; and
forming the first thin film on the light exit side of the pixel elements comprises: forming the first thin film on the light exit side of the white-light OLED elements.

11. The fabricating method according to claim 10, wherein the first thin film layer is a silicon based semiconductor material or a metal oxide semiconductor material; and
forming the photon crystal areas, corresponding to each of the sub-pixel elements, at the first thin film layer comprises:
coating the first thin film layer with a photo resist layer;
forming a polymer molecule film layer above the photo resist layer, wherein the polymer molecule film layer comprises polymer molecules arranged uniformly at a preset space;
shielding the sub-pixel elements, to display light in other colors, using a mask, while only exposing one sub-pixel element to display light in one color, and illuminating the photoresist layer with light at a first inclination angle for a first preset length of time while being shielded by the polymer molecules;
moving the mask to shield the sub-pixel elements for displaying light in other colors while only exposing another sub-pixel element for displaying light in another color rather than the one color, and illuminating the photoresist layer with light at a second inclination angle for a second preset length of time while being shielded by the polymer molecules until all the sub-pixel elements for displaying colors are exposed;
removing the polymer molecule film layer;
forming a pattern of the photoresist layer through development; and
removing a part of the first thin film layer, which is not covered with the photo resist layer, and forming the micro-hole structures in each of the photon crystal areas at the first thin film layer.

12. The fabricating method according to claim 10, wherein the first thin film layer is photosensitive resin material; and
forming the photon crystal areas, corresponding to each of the sub-pixel elements, at the first thin film layer comprises:
forming a polymer molecule film layer above the first thin film layer, wherein the polymer molecule film layer comprises polymer molecules arranged uniformly at a preset space;
shielding the sub-pixel elements for displaying light in other colors, using a mask, while only exposing one sub-pixel element for display light in one color, and illuminating the photoresist layer with light at a first inclination angle for a first preset length of time while being shielded by the polymer molecules;
moving the mask to shield the sub-pixel elements for displaying light in other colors while only exposing another sub-pixel element for displaying light in another color rather than the one color, and illuminating the photoresist layer with light at a second inclination angle for a second preset length of time while being shielded by the polymer molecules until all the sub-pixel elements for displaying colors are exposed;
removing the polymer molecule film layer; and removing a part of the first thin film layer, which is covered with the polymer molecules, through development, and forming the micro-hole structures in each of the photon crystal areas at the first thin film layer.

13. The fabricating method according to claim 11, wherein forming the polymer molecule film layer comprises:
   determining a quantity of polymer molecules to be needed, according to an area to be coated and a diameter of a polymer molecule;
   determining a volume of polymer solution to be needed, according to the quantity of polymer molecules to be needed, and a density of the polymer solution; and
   dropping the polymer solution in the area to be coated, in droplets.

* * * * *